United States Patent [19]

Hoedlmayr et al.

[11] Patent Number: 5,119,044

[45] Date of Patent: Jun. 2, 1992

[54] INDUCTIVE PROXIMITY SWITCH WITH SLIGHT TEMPERATURE DEPENDENCY

[75] Inventors: Franz Hoedlmayr, Munich; Michael Lenz, Zorneding, both of Fed. Rep. of Germany

[73] Assignee: Siemens Aktiengesellschaft, Munich, Fed. Rep. of Germany

[21] Appl. No.: 717,679

[22] Filed: Jun. 19, 1991

[30] Foreign Application Priority Data

Jun. 19, 1990 [EP] European Pat. Off. ........ 90111589.9

[51] Int. Cl.⁵ .................. G01N 27/00; H03B 1/00
[52] U.S. Cl. ............................ 331/65; 331/117 R; 324/327
[58] Field of Search ........ 331/65, 66, 117 R, 117 FE, 331/117 D, 167; 324/236, 327; 361/179, 180

[56] References Cited

U.S. PATENT DOCUMENTS

| 4,609,882 | 9/1986 | Gehring et al. | 331/117 R X |
|---|---|---|---|
| 4,806,882 | 2/1989 | Gehring et al. | 331/117 R X |
| 4,942,372 | 7/1990 | Heimlicher | 331/65 |
| 4,949,054 | 8/1990 | Briefer | 331/117 R X |
| 5,043,679 | 8/1991 | Kriz et al. | 331/117 R X |

FOREIGN PATENT DOCUMENTS 63-198414 8/1988 Japan.

*Primary Examiner*—Robert J. Pascal
*Attorney, Agent, or Firm*—Herbert L. Lerner; Laurence A. Greenberg

[57] ABSTRACT

An inductive proximity switch with adjustable switching hysteresis includes a presence indicator having an oscillator with an oscillating circuit and oscillator amplifier, a switch amplifier connected downstream of the presence indicator, an electronic switch controllable by the presence indicator through the switch amplifer, and a demodulator assigned to the oscillator. The presence indicator has an electronic circuit with a temperature dependency compensating for a temperature dependency of the switching point of the inductive proximity switch. The temperature dependency of the switching point of the inductive proximity switch is dictated by the temperature dependency of the quality of the oscillating circuit.

7 Claims, 2 Drawing Sheets

INDUCTIVE PROXIMITY SWITCH WITH SLIGHT TEMPERATURE DEPENDENCY

BACKGROUND OF THE INVENTION

1. Field of the Invention

The invention relates to an inductive proximity switch with adjustable switching hysteresis, having a presence indicator including an oscillator with an oscillating circuit and an oscillator amplifier, a switch amplifier connected downstream of the presence indicator, an electronic switch controllable by the presence indicator through the switch amplifier, and a demodulator assigned to the oscillator.

2. Description of the Related Art

Such inductive proximity switches are known in principle and are described, among other sources, in German Published, Non-Prosecuted Application DE 37 22 335 A1, and in the publications mentioned therein.

In the known inductive proximity switches, the switch spacing is dependent on the quality of the resonant circuit of the oscillator. The quality of a resonant circuit, which includes a coil with a ferrite core and a capacitor, depends on the coil loss factor, among other factors. As can be found in the Siemens Data Book for 1990/1991, entitled "Ferrite und Zubehör" [Ferrites and Accessories], especially page 35, the coil loss factor is temperature-dependent. For the Siemens material known as N48 that can be used in inductive proximity switches, the loss factor is at a minimum, within the operating temperature range of interest for inductive proximity switches. In other words, above and below a certain temperature, the loss factor increases. In known inductive proximity switches, the temperature dependency of the switch spacing is partly compensated for with additional components, such as hot conductors, cold conductors, diodes or resistors. At least with a view to the simplest possible circuit layout using monolithic integration, such compensatory provisions are complicated, and the improvements in temperature dependency that are attained are relatively slight. With such known provisions, a deviation in the switch spacing of approximately ±10% over a temperature range of approximately 100° can be attained.

It is accordingly an object of the invention to provide an inductive proximity switch with slight temperature dependency, with adjustable hysteresis and a presence indicator including an oscillator, which overcomes the hereinafore-mentioned disadvantages of the heretofore-known devices of this general type, which has a switch spacing that is considerably less temperature-dependent, and which can be largely monolithically integrated.

SUMMARY OF THE INVENTION

With the foregoing and other objects in view there is provided, in accordance with the invention, an inductive proximity switch with adjustable switching hysteresis, comprising a presence indicator having an oscillator with an oscillating circuit and oscillator amplifier, a switch amplifier connected downstream of said presence indicator, an electronic switch controllable by said presence indicator through said switch amplifier, and a demodulator assigned to said oscillator, said presence indicator having an electronic circuit with a temperature dependency compensating for a temperature dependency of the switching point of the inductive proximity switch, the temperature dependency of the switching point of the inductive proximity switch being dictated by the temperature dependency of the quality of said oscillating circuit.

In accordance with another feature of the invention, the presence indicator includes an electronic oscillator circuit having a temperature dependency compensating for a temperature dependency of the switching point of the inductive proximity switch, and the temperature dependency of the switching point of the inductive proximity switch is dictated by the temperature dependency of the quality of said oscillating circuit.

In accordance with a further feature of the invention, the presence indicator includes an electronic demodulator circuit having a temperature dependency compensating for a temperature dependency of the switching point of the inductive proximity switch, and the temperature dependency of the switching point of the inductive proximity switch is dictated by the temperature dependency of the quality of said oscillating circuit.

In accordance with an added feature of the invention, the demodulator circuit has a current mirror circuit, and a Darlington stage only responding above a certain temperature in the switching point of the inductive proximity switch and counteracting said current mirror circuit in the event of a response.

In accordance with a concomitant feature of the invention, the oscillator amplifier circuit has a current mirror circuit, and a Darlington stage only responding above a certain temperature in the switching point of the inductive proximity switch.

The heart of the present invention is the use of an oscillator/demodulator circuit in an inductive proximity switch that is constructed in such a way that its temperature characteristic compensates for the temperature characteristic of the oscillating circuit which is connected to the oscillator/demodulator circuit and is dependent on the temperature behavior of the ferrite core being used. This is attained due to the fact that the temperature characteristic of the oscillator/demodulator circuit approximately represents the axially mirror-symmetrical course of the temperature characteristic of a coil wound with copper wire on a ferrite core. The circuitry provisions necessary to achieve this may be made either on the oscillator amplifier or in the demodulator, or in both the oscillator amplifier and the demodulator. Since the switching point of the inductive proximity switch, that is the spacing between a metal part and the coil of a presence indicator, depends on the quality of the resonating circuit, on the dimensions of the oscillator amplifier circuit, and on the layout of the demodulator circuit, but the temperature dependency of the quality of the oscillating circuit in contrast is largely defined by the ferrite core being selected, the invention intends to counteract the temperature dependency of the switching point, which is defined by the oscillating circuit, by adapting the temperature dependency of the switching point defined by the oscillator amplifier circuit and/or by the demodulator circuit.

Published European Application Nos. 0 172 393 A1 and 0 207 372 A1 disclose an oscillator/demodulator circuit configuration for an inductive proximity switch. Variants of this known oscillator/demodulator circuit configuration according to the invention will be described below. Naturally, one skilled in the art has the opportunity of modifying other oscillator and/or demodulator circuits as well in order to make an inductive proximity switch according to the invention.

Other features which are considered as characteristic for the invention are set forth in the appended claims.

Although the invention is illustrated and described herein as embodied in an inductive proximity switch with slight temperature dependency, it is nevertheless not intended to be limited to the details shown, since various modifications and structural changes may be made therein without departing from the spirit of the invention and within the scope and range of equivalents of the claims.

BRIEF DESCRIPTION OF THE DRAWINGS

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
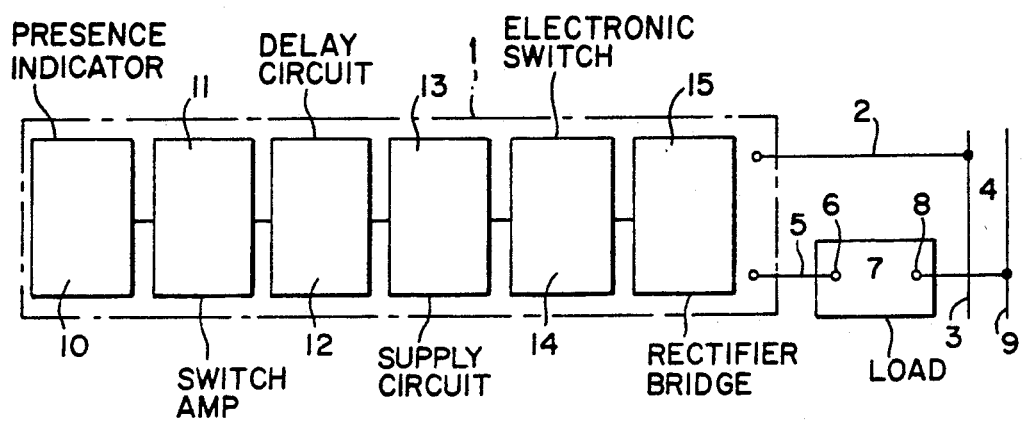
FIG. 1 is a block circuit diagram of an inductive proximity switch 1 of the kind shown in German Published, Non-Prosecuted Application DE 37 22 335 A1, among other sources.

Referring now to the figures of the drawing in detail and first, particularly, to FIG. 1 thereof, there is seen an inductive proximity switch 1 in a block circuit diagram which operates in a contactless manner. In other words, the switch 1 responds to a non-illustrated approaching metal part, for instance, and in the exemplary embodiment shown it is connected through an external conductor 2 to one pole 3 of an operating voltage source 4 and only through a further external conductor 5 to one terminal 6 of a load or consumer 7, while another terminal 8 of the load 7 is connected to another pole 9 of the operating voltage source 4. Accordingly, the inductive proximity switch 1 is connected to both the operating voltage source 4 and the load 7 through a total of only two external conductors 2, 5 in a known manner. Naturally, inductive proximity switches 1 are also known that are connected parallel to the load 7 to the other pole 9 of the operating voltage source 4 through a third conductor, in order to be supplied with their supply voltage.

As FIG. 1 shows, the inductive proximity switch 1 which is shown in its basic structure, includes a presence indicator 10 that can be influenced externally, in this case an oscillator with an associated demodulator; a switch amplifier 11 connected downstream of the presence indicator 10; an electronic switch 12, for instance a thyristor or transistor that is controllable by the presence indicator 10 through the switch amplifier 11; a supply circuit 13 for furnishing a supply voltage for the presence indicator 10 and the switch amplifier 11; and a delay circuit 14 that prevents turn-on pulses. On the input side, a rectifier bridge 15 is also provided, if the operating voltage source 4 is a source of operating voltage.

The teaching of the invention does not have to do with the structure of the switch amplifier 11, the controllable electronic switch 12, the supply circuit 13, the delay circuit 14 or the rectifier bridge 15, and therefore in this respect the drawing figures do not show details. Possible and preferred embodiments of these circuit elements for the inductive proximity switch 1 may be taken from the aforementioned German Published, Non-Prosecuted Application DE 37 22 335 A1, the references cited in it, and the 1989/90 Siemens Data Book entitled "ICs fuer Industrielle Anwendungen" [ICs for Industrial Applications] pp. 798-812, and from the integrated components TCA 205, TCA305 and TCA355 described therein.

Figure 2:
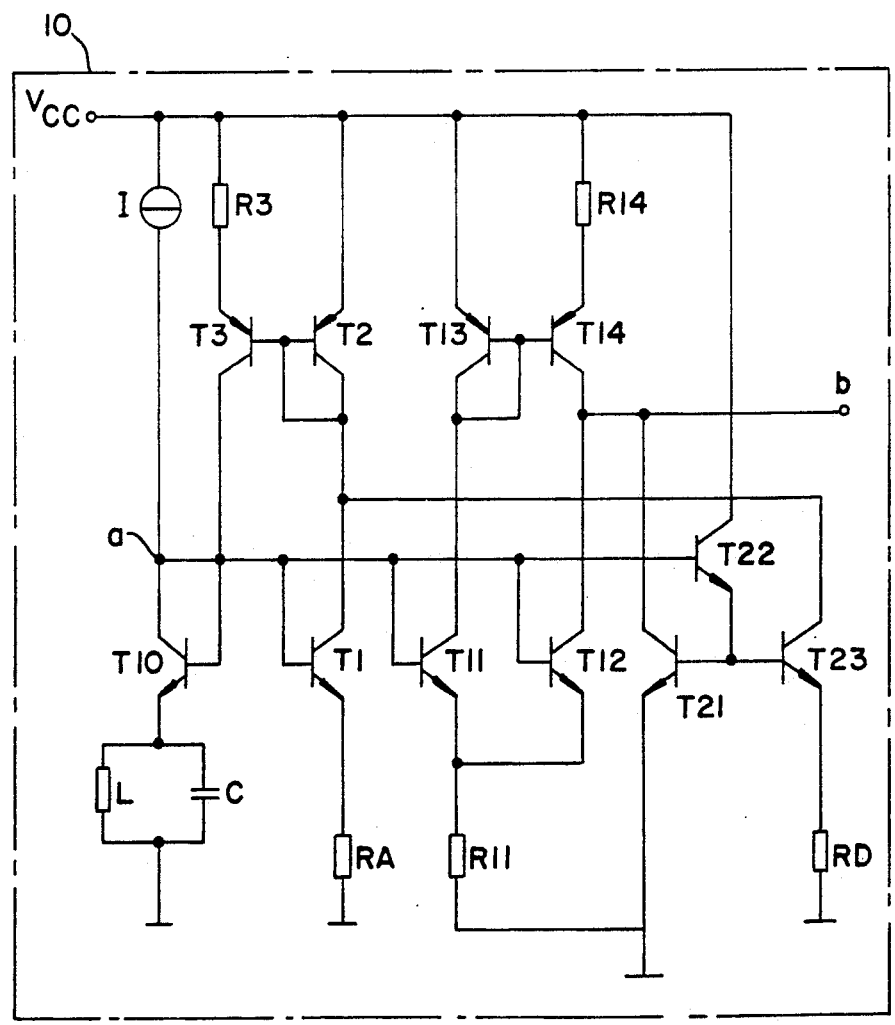
FIG. 2 is a more detailed schematic and block circuit diagram of a portion of the inductive proximity switch 1 of FIG. 1, namely a known oscillator/demodulator circuit, which is modified according to the invention, to make an inductive proximity switch according to the invention.

Aside from transistors T21, T22 and T23 and a resistor RD, the circuit shown in FIG. 2 is largely equivalent to the oscillator/demodulator circuit known from Published European Application Nos. 0 172 393 A1 and 0 207 372 A1. This oscillator/demodulator circuit includes a constant current source I, which is connected between a supply potential $V_{CC}$ and a circuit node a. The supply potential $V_{CC}$ is also connected through a resistor R3 to the emitter terminal of a transistor T3, it is connected directly to the emitter terminal of a transistor T2 and to the emitter terminal of a transistor T13, and it is also connected through a resistor R14 to the emitter terminal of a transistor T14. The base lead of the transistor T2 and the base lead of the transistor T3 are connected in common to both the collector lead of the transistor T2 and the collector lead of a transistor T1. The base lead of the transistor T13 and the base lead of the transistor T14 are connected in common to the collector lead of the transistor T13 and to the collector lead of a transistor T11. The collector lead of a transistor T12 and the collector lead of the transistor T14 together form a circuit node b. Connected to the circuit node a are the collector lead and base lead of a transistor T10, the collector lead of the transistor T3, the base lead of the transistor T1, the base lead of the transistor T11, and the base lead of the transistor T12. The emitter lead of the transistor T10 is connected to a reference potential or ground, through a parallel circuit of an inductance L and a capacitance C. The emitter lead of the transistor T1 is likewise connected to the reference potential or ground, through a resistor RA. The emitter lead of the transistor T11 and the emitter lead of the transistor T12 are connected in common to the reference potential, through a resistor R11.

The mode of operation of the oscillator/demodulator circuit described thus far is described in detail in the aforementioned published patent applications. The transistor T1 and the transistor T3 are each operated in an emitter circuit for the oscillator, and they form active element of the oscillator circuit. Each of these emitter circuits furnishes a 180° component to meet the phase condition of oscillation equalization. The joint coupling between the transistor T1 and the transistor T3 is achieved with the aid of a current mirror circuit formed by the transistor T2 that is connected as a diode, and the transistor T3. The parallel oscillating circuit, which is constructed of the inductance L and the capacitance C, is connected to the base lead of the transistor T1 and thus to the circuit node a, through the transistor T10, which is connected as a diode and acts as a frequency-determining element. The transistor T10 serving as a diode is provided in this case solely as a level shifting circuit, in order to assure that starting oscillation is possible for a parallel oscillating circuit connected directly to the reference potential or ground. The transistors T11 and T12 are triggered at their base leads, in each case with the same signal as the transistor T1. The transistor T11 impresses a current upon the transistor T13 that is connected as a diode, which flows in the transistor T14 as well, because of the current mirror circuit with the step-up ratio of the emitter area ratio of the transistors T13 and T14. The output signal of the oscillator/demodulator circuit of FIG. 2 is furnished at the circuit node b formed by the collectors of the transistor T14 and the transistor T12. Through the use of a suitable step-up ratio of the emitter areas of the current mirror transistors T13 and T14, and by suitable dimensioning of the resistors R14 and R11, whenever the oscillation amplitude at the circuit node a exceeds a certain value, a low potential is present at the circuit node b, while whenever an oscillation amplitude that is not as high is present at the circuit node a, a high potential is present at the circuit node b.

Beyond the known oscillator/demodulator circuit, FIG. 2 also shows the transistor T21 having its the collector lead connected to the circuit node b and its emitter lead connected to the reference potential or ground. The base lead of this transistor T21 is connected to the emitter lead of the transistor T22 which has its collector lead connected to the supply potential $V_{CC}$ and its base lead connected to the circuit node a. The transistors T21 and T22 form a kind of Darlington circuit, but the collector leads of the two transistors are not connected to the same potential. On the base side, the transistor T22 is triggered with the same signal as the transistors T1, T11 and T12, but its emitter potential is higher than the reference potential or ground by the base-to-emitter voltage of the transistor T21. This assures that the Darlington stage formed by the transistors T21 and T22 does not become operative until a certain potential at the circuit node a is exceeded. By tuning the emitter potentials of the transistors T11, T12 and of the transistor T22, which can be varied by the selection of currents impressed by the transistors T13 and T14, by the selection of the resistances of the resistors R11 and R14, and by the selection of the base-to-emitter voltage of the transistor T21, optionally with the aid of further level shifting devices, the voltage level at which the Darlington circuit constructed of the transistors T21 and T22 becomes operative, can be adjusted. FIG. 2 also shows a further transistor T23, the collector lead of which is connected to a circuit node formed by the base leads of the transistors T3 and T2, the collector lead of the transistor T2 and the collector lead of the transistor T1. The emitter lead of the transistor T23 is connected to the reference potential or ground through the resistor RD. The base lead of this transistor T23, like the base lead of the transistor T21, is connected to the emitter lead of the transistor T22 and thus forms a Darlington circuit with the transistor T22 in the same manner as the transistor T21. This Darlington circuit likewise does not become operative until the potential at the circuit node a exceeds a certain level. If the Darlington stage formed of the transistor T22 and the transistor T23 becomes operative, then the oscillator formed by the transistors T1, T2 and T3 is damped. The degree to which the oscillator circuit is influenced by the Darlington stage formed of the transistors T23 and T22 is variable by means of the selection of the resistor RD. With respect to the potential value at the circuit node a at which the Darlington stage formed by the transistors T22 and T23 becomes operative, the discussion of the Darlington stage formed by the transistors T21 and T22 applies accordingly.

The output current of a current mirror circuit, for instance the collector current of the transistor T14 in the demodulator stage, or the collector current of the transistor T3 in the oscillator circuit, increases with increasing temperature. Since the current mirror circuit formed of the transistors T13 and T14 furnishes a higher output signal as the current becomes higher, the temperature behavior of the demodulator circuit described above is suitable for compensating for the temperature behavior of a coil with a ferrite core for temperatures below the maximum in quality of this coil. The same applies to the current mirror circuit formed of the transistors T2 and T3, with respect to the oscillator circuit. The maximum quality of coils suitable for inductive proximity switches is at approximately 25° C. to 50° C.

The temperature behavior of a Darlington circuit such as that formed of the transistors T21 and T22 or of the transistors T23 and T22 is such that with increasing temperature, the base-to-emitter voltage required for making the Darlington stages conductive becomes lower. As a result, the temperature behavior of this Darlington stage, which is formed of the transistors T21 and T22 or T22 and T23, is suitable for compensating for the temperature behavior of a coil with a ferrite core for temperatures above the temperature at which the quality of this coil is maximal. If the circuit according to the invention as shown in FIG. 2 is dimensioned in such a way that the Darlington circuit, including the transistors T21 and T22 or the transistors T22 and T23 is used in the switching point of the demodulator in the temperature range in which the quality of the coil with the ferrite core is maximal, then superimposition of the temperature characteristic of the demodulator circuit, in particular of the transistors T13 and T14 and of the oscillator circuit, and the temperature characteristic of the Darlington circuit formed of the transistors T21 and T22 and the Darlington circuit formed of the transistors T22 and T23 from the time the Darlington circuits come into operation leads to a total temperature characteristic that is suitable for compensating for the temperature characteristic of the quality of the coil with the ferrite core. Through the use of a suitable selection of the current intensity of the various Darlington circuits and by varying the resistor RD, the temperature characteristic can be tuned in a suitable manner.

If at all possible, the transistor T22 should become conducting when the potential value at the circuit node a at which the output signal of the demodulator stage changes between a high level and a low level is reached, and especially at the temperature at which the coil with the ferrite core has the greatest quality. If the transistor T22 blocks, then the transistor T21 blocks as well, and is thus inoperative for the circuit node b and therefore for the signal output of the oscillator/demodulator circuit. The logical state of the output signal of the oscillator/demodulator circuit is then dependent only upon whether the collector current of the transistor T14 is greater than or less than the collector current of the transistor T12, that is whether as a function of the potential at the circuit node a the amplification effected by the emitter area ratio of the transistors T13 and T14 is greater than the potential decrease at the emitter of the transistor T14 that is effected by the resistor R14 and becomes greater as the current mirror current increases. If the transistor T22 is conducting, a current is drawn from the circuit node b through the collector lead of the transistor T21, which current is defined by the emitter current of the transistor current T22 and the current amplification of the transistor T21. With respect to the circuit node b, this current has the same algebraic sign (+ or −) as the collector current of the transistor T12, or the opposite sign from the collector current of the transistor T14. The switching point that is defined by the oscillator/demodulator circuit is shifted as a result. The transistor T23 is likewise triggered by the transistor T22 simultaneously with the transistor T21. If the transistor T23 blocks, it is inoperative for the amplification and thus for the signal amplitude of the oscillator stage. If the transistor T23 begins to conduct at the switching point in the temperature range in which the quality of the oscillating circuit LC of the oscillator is at a maximum, then its collector current raises the current in the transistor T2 and, because of the current mirror circuit, raises the current in the transistor T3 as well. The thus-effected additional collector current of the transistor T3 flows through the transistor T10 connected as a diode into the coil L of the oscillating circuit LC and thus shifts the switching point of the proximity switch. Above the temperature at which the quality of a coil with a ferrite core is at a maximum, this shift in the switching point counteracts the temperature-dependent switch in the switching point dictated by the temperature dependency of the quality of a coil having a ferrite core.

FIG. 2 discloses a circuit variant in which both the oscillator amplifier circuit and the demodulator circuit are adapted in such a way that their temperature-dependent effects on the switching point of the proximity switch counteract the temperature dependency of the switching point of the proximity switch that is dictated by the temperature dependency of the quality of the oscillating circuit of the oscillator. However, it would also suffice for either the oscillator amplifier or the demodulator to be adapted accordingly.

Figure 3:
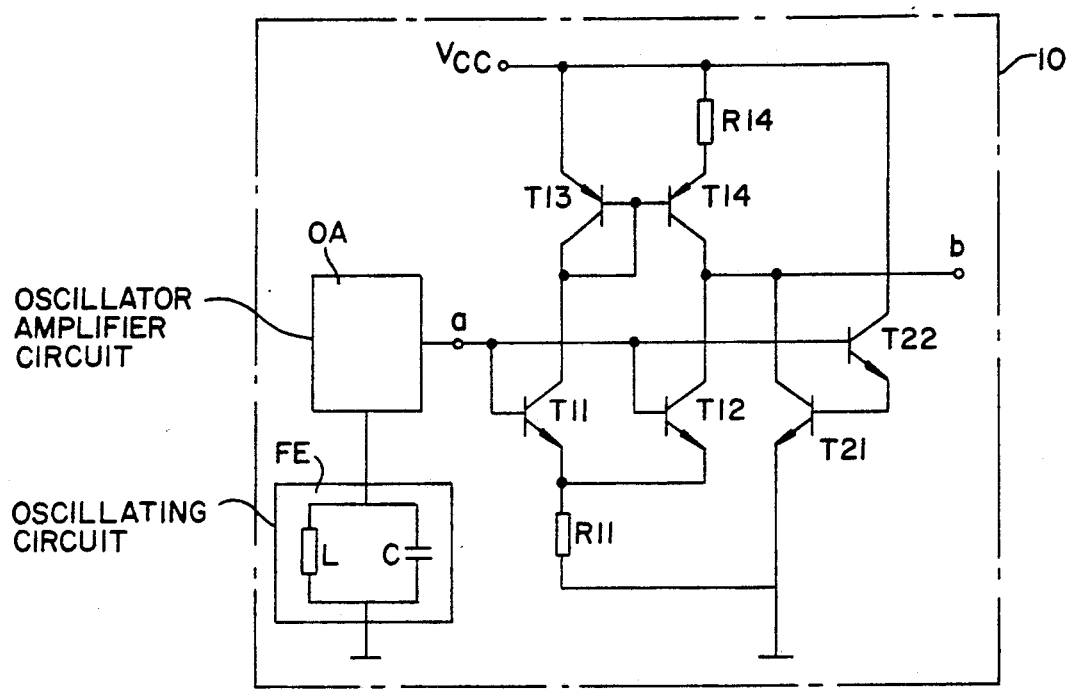
FIG. 3 is a more detailed schematic and block circuit diagram of a portion of the inductive proximity switch 1 of FIG. 1, namely a demodulator circuit, which is modified according to the invention, for use with an arbitrary oscillator circuit OA, FE.

FIG. 3 is a block circuit diagram showing an oscillator amplifier circuit OA with an oscillating circuit FE, which in particular includes an inductance L and a capacitor C connected parallel thereto and is connected to the reference potential or ground. The oscillator amplifier OA is connected to a circuit node a, which is also interconnected with the base leads of a transistor T11, a transistor T12 and a transistor T22. The emitter leads of the transistors T11 and T12 are connected in common to the reference potential or ground, through a resistor R11. The emitter lead of the transistor T22 is connected to the base lead of a transistor T21, having its emitter lead connected to the reference potential or ground. The collector lead of the transistor T11 is connected both to the collector lead and to the base lead of a transistor T13 and to the base lead of a transistor T14. The transistor T13 is connected as a diode in this case and is distinguished from the transistor T14 in the emitter area size, among other factors. The emitter lead of the transistor T13 and the collector lead of the transistor T22 are connected directly to a supply potential $V_{CC}$. The emitter lead of the transistor T14 is connected through a resistor R14 to the supply potential $V_{CC}$. The collector lead of the transistor T12, the collector lead of the transistor T14 and the collector lead of the transistor T21 form a circuit node b, which represents the signal output of the signal demodulator circuit described above. The circuit layout of the demodulator circuit disclosed in FIG. 3 does not differ from the circuit layout of the demodulator circuit shown in FIG. 2. The mode of operation is identical as well.

The demodulator circuit as disclosed in FIG. 3 is suitable, in combination with any known oscillator amplifier OA, for compensating for the temperature dependency, dictated by the temperature dependency of the quality of the oscillating circuit FE, of the switching point of an inductive proximity switch constructed with it.

Figure 4:
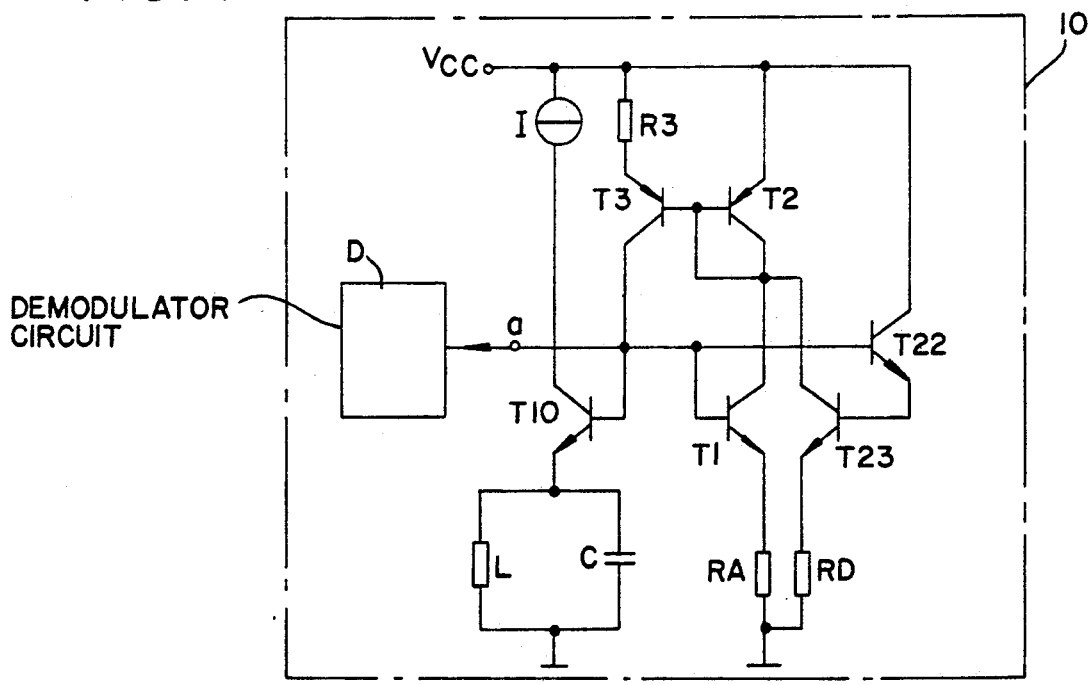
FIG. 4 is a more detailed schematic and block circuit diagram of a portion of the inductive proximity switch 1 of FIG. 1, namely an oscillator circuit, which is modified according to the invention and can be combined with an arbitrary demodulator circuit D.

FIG. 4 shows the oscillator circuit disclosed in FIG. 2, including a current source I, which is disposed between a supply potential $V_{CC}$ and a circuit node a. An arbitrary demodulator circuit D is connected to the circuit node a. The circuit node a also connects the collector lead and the base lead of a transistor T10, the collector lead of a transistor T3, the base lead of a transistor T1, and the base lead of a transistor T22, to one another. The emitter lead of the transistor T1 is connected to the reference potential or ground through a resistor RA. The emitter lead of the transistor T10, which is connected as a diode, is connected to the reference potential or ground through a parallel circuit of a capacitor C and an inductance L. The collector lead of the transistor T1 is interconnected with the collector lead of a transistor T2 and the collector lead of a transistor T23 and is also connected to the base lead of the transistor T2 and to the base lead of the transistor T3. The transistors T2 and T3 thus form a current mirror circuit. The emitter lead of the transistor T2 is connected directly to the supply potential $V_{CC}$, and the emitter lead of the transistor T3 is connected to this supply potential VCC through a resistor R3. The base lead of the transistor T23 is interconnected with the emitter lead of the transistor T22 and with it forms a Darlington stage. The emitter lead of the transistor T23 is connected to the reference potential or ground through a resistor RD. The resistor RD is not necessary for the operation of the circuit in this case. However, by varying this resistor RD, optionally to zero Ohms, the temperature dependency of the switching point of the proximity switch dictated by the Darlington stage T22, T23 can be individually adapted to the temperature dependency of the switching point dictated by the oscillating circuit. The collector lead of the transistor T22 is connected to the supply potential $V_{CC}$.

The mode of operation of such an oscillator circuit, in particular with respect to the temperature compensation, is described above in conjunction with FIG. 2. This circuit is again suitable for compensating for the temperature dependency, dictated by the quality of the oscillating circuit LC, of the switching point of an inductive proximity switch 1 made with it.

We claim:
1. An inductive proximity switch with adjustable switching hysteresis, comprising a presence indicator having an oscillator with an oscillating circuit and oscillator amplifier, a switch amplifier connected downstream of said presence indicator, an electronic switch controllable by said presence indicator through said switch amplifier, and a demodulator assigned to said oscillator, said presence indicator having an electronic circuit with a temperature dependency compensating for a temperature dependency of the switching point of the inductive proximity switch, the temperature dependency of the switching point of the inductive proximity switch being dictated by the temperature dependency of the quality of said oscillating circuit.

2. The inductive proximity switch according to claim 1, wherein said presence indicator includes an electronic oscillator circuit having a temperature dependency compensating for a temperature dependency of the switching point of the inductive proximity switch, and the temperature dependency of the switching point of the inductive proximity switch is dictated by the temperature dependency of the quality of said oscillating circuit.

3. The inductive proximity switch according to claim 1, wherein said presence indicator includes an electronic demodulator circuit having a temperature dependency compensating for a temperature dependency of the switching point of the inductive proximity switch, and the temperature dependency of the switching point of the inductive proximity switch is dictated by the temperature dependency of the quality of said oscillating circuit.

4. The inductive proximity switch according to claim 1, wherein said demodulator circuit has a current mirror circuit, and a Darlington stage only responding above a certain temperature in the switching point of the inductive proximity switch and counteracting said current mirror circuit in the event of a response.

5. The inductive proximity switch according to claim 3, wherein said demodulator circuit has a current mirror circuit, and a Darlington stage only responding above a certain temperature in the switching point of the inductive proximity switch and counteracting said current mirror circuit in the event of a response.

6. The inductive proximity switch according to claim 1, wherein said oscillator amplifier circuit has a current mirror circuit, and a Darlington stage only responding above a certain temperature in the switching point of the inductive proximity switch.

7. The inductive proximity switch according to claim 2, wherein said oscillator amplifier circuit has a current mirror circuit, and a Darlington stage only responding above a certain temperature in the switching point of the inductive proximity switch.

* * * * *